United States Patent [19]
Howard et al.

[11] Patent Number: 5,466,892
[45] Date of Patent: Nov. 14, 1995

[54] CIRCUIT BOARDS INCLUDING CAPACITIVE COUPLING FOR SIGNAL TRANSMISSION AND METHODS OF USE AND MANUFACTURE

[75] Inventors: James R. Howard, Santa Clara; Gregory L. Lucas, Newark, both of Calif.

[73] Assignee: Zycon Corporation, Santa Clara, Calif.

[21] Appl. No.: 13,076

[22] Filed: Feb. 3, 1993

[51] Int. Cl.$^6$ .................................................... H05K 1/16
[52] U.S. Cl. .......................... 174/261; 174/255; 174/250; 361/748; 361/795
[58] Field of Search ................................ 174/261, 255, 174/250; 361/790, 795, 748

[56] References Cited

U.S. PATENT DOCUMENTS

| | | | |
|---|---|---|---|
| 3,921,167 | 11/1975 | Fox | 340/365 C |
| 4,261,042 | 4/1981 | Ishiwatari et al. | 364/709 |
| 4,268,614 | 5/1981 | Ueyama et al. | 430/315 |
| 4,290,052 | 9/1981 | Eichelberger et al. | 340/365 C |
| 4,380,040 | 4/1983 | Posset | 361/280 |
| 4,413,252 | 11/1983 | Tyler et al. | 340/365 C |
| 4,613,771 | 9/1986 | Gal | 307/443 |
| 4,626,805 | 12/1986 | Jones | 333/33 |
| 4,739,317 | 4/1988 | Rowe et al. | 361/386 |
| 4,743,895 | 5/1988 | Alexander | 340/712 |
| 4,855,550 | 8/1989 | Scultz, Jr. | 200/600 |
| 4,891,789 | 1/1990 | Quattrini et al. | 365/63 |
| 4,959,708 | 9/1990 | Hendersen et al. | 357/84 |
| 5,172,304 | 12/1992 | Ozawa et al. | 361/401 |

FOREIGN PATENT DOCUMENTS

| | | | |
|---|---|---|---|
| 610249 | 11/1990 | Australia | H05K 1/18 |

OTHER PUBLICATIONS

Henry W. Ott, *Noise Reduction Techniques in Electronic Systems*, 2nd Ed., Wiley & Sons (1980), pp. 29–43; 70–72.

*Primary Examiner*—Laura Thomas
*Attorney, Agent, or Firm*—John A. Bucher; Robert Charles Hill

[57] ABSTRACT

A circuit board and method of forming a circuit board with signal and receptor pads arranged on layers spaced apart in a Z direction with a dielectric layer therebetween, parameters of a resulting AC signal transmitting circuit resulting wherein:

capacitive reactance is defined by the equation (I)

$$X_c = \frac{1}{2\pi FC}$$

where F is frequency and C is capacitance;

inductive reactance is defined by the equation (II)

$$X_L = 2\pi FL$$

where F is frequency and L is inductance;

capacitance is defined by the equation (III)

$$C = \frac{AED}{\tau}$$

where A is the effective mutual area of the signal and receptor pads, D is Faraday's constant, E is the dielectric constant, and $\tau$ is the thickness of the dielectric layer; and inductance is defined by the equation (IV)

$$L = 0.005 \ln(4h/d) \mu H/in.$$

where ln indicates the natural logarithm for the value 4h/d, where h is the distance above a ground plane, and d is the equivalent diameter of a conductor;

wherein capacitance and inductance are established in equations I and II with $X_C$ and $X_L$ being equal or approaching equality and the values of A, D, $\tau$, $I_N$, h (etc.) are preselected or calculated from equations III and IV.

14 Claims, 3 Drawing Sheets

CIRCUIT BOARDS INCLUDING CAPACITIVE COUPLING FOR SIGNAL TRANSMISSION AND METHODS OF USE AND MANUFACTURE

FIELD OF THE INVENTION

The present invention relates to circuit boards including printed circuit boards and the like and more specifically to signal transmission in such circuit boards.

BACKGROUND OF THE INVENTION

The present invention is directed toward circuit boards or substrates for devices such as printed circuit boards. In order to adapt these circuit boards as substrates for electronic devices which may be present in very large numbers, it is commonly necessary to provide often complex circuitry on both external and internal surfaces of the boards in order to achieve signal transmission necessary for proper operation of the devices.

The term "circuit board" is employed herein to include printed circuit boards and other device substrates such as integrated devices, multi-chip modules and similar devices having signal traces on different layers.

Substantial effort has been expended in the prior art in order to improve signal transmission capabilities in such circuit boards. For example, printed circuit boards are commonly provided with large numbers of signal transmitting circuits on at least one signal layer of the boards. More commonly, such circuits are formed on multiple layers of the boards including both external surfaces of the boards as well as one or more internal surfaces. Even with such arrangements, space is critically limited on such boards for achieving various functions contemplated in connection with devices to be mounted on the surfaces of the boards. Accordingly, the prior art has been concerned with designs and configurations for such circuit boards permitting the use of even larger numbers of circuits for signal transmission between various portions of the circuit boards.

For example, U.S. Pat. No. 4,891,789 issued Jan. 2, 1990 to Quattrini, et al. disclosed a surface mounted multilayer memory printed circuit board designed and constructed with its top and bottom layers containing repetitive integrated circuit (IC) chip component hole/pad and interconnection line patterns preferably forming mirror images of one another. The board of this patent used surface mounted techniques in which the integrated chip components of the memory array were mounted and soldered to both sides of the board thereby doubling the density or capacity of the memory board. The integrated circuit memory chips, mounted on the top and bottom surfaces of the board, were aligned with each other for sharing common through-holes or vias in which logically equivalent input connections were exchanged in a manner for reducing the number of holes and links of connective wiring.

The above reference demonstrates the need for substantial signal transmitting circuits on printed circuit boards as well as other components mounted for example on the surfaces of the printed circuit board to provide a substrate for various electronic devices.

The above patent is also illustrative of the use of through-holes or vias which are characterized as elements formed from conductive material and extending partially or entirely through the circuit board in the Z direction for transmitting signals between various layers of the board. Through-holes and vias are both well known devices for achieving such signal transmission.

As noted above, other types of circuit boards or device substrates similarly employ large numbers of circuits for signal transmission between various portions of the circuit boards and/or devices mounted thereon. For example, U.S. Pat. No. 4,739,448 issued Apr. 19, 1988 to Rowe, et al. disclosed a microwave multiport multilayered integrated circuit chip carrier including multiple signal layers. U.S. Pat. No. 4,959,708 issued Sep. 25, 1990 to Henderson, et al. disclosed an MOS integrated circuit in which a plurality of MOS devices are arranged or mounted upon a substrate and interconnected with each other and with signal, power and ground pads in multiple electrical circuits adapted to process separate electrical signals.

U.S. Pat. No. 4,613,771 issued Sep. 23, 1986 to Gal disclosed a similar integrated circuit wherein a circuit was integrated into a substrate with improved noise immunity being provided by various components.

Many prior art references such as the representative ones noted above illustrate the need for large numbers of signal transmitting circuits in such substrates. The representative references discussed above also commonly employ conductive elements extending in a Z direction through the substrate for providing signal communication between different levels of the circuit boards. These conductive elements are generally similar to the through-holes and vias discussed initially above.

Yet another prior art approach for providing large numbers of circuits subject to "customization" employed interconnects as building blocks for electronic circuitry and microcircuitry to typically receive and support further electrical devices or substrates capable of being electrically interconnected with each other to provide larger, more complex electrical structures. So-called "programmable interconnects" were then employed in order to permit mass production of substrates with their circuitry subsequently being programmed to produce a variety of wiring plans as required by a user.

Such an arrangement was disclosed for example in U.S. Pat. No. 4,458,297 and in Australian Convention application No. 610,249 by Microelectronics and Computer Technology Corporation.

These references disclosed yet another approach for providing complex and yet programmable circuitry in circuit boards of the type contemplated by the present invention. More specifically, the circuit boards contemplated by these references may be adapted for a variety of applications or uses. However, they are also representative of circuit boards or substrates wherein it is desirable to transmit signals throughout one or more X-Y planes of the substrate as well as possibly in a Z direction through the substrate.

SUMMARY OF THE INVENTION

The above references are illustrative of various prior art techniques for providing multiple circuit paths in various types of circuit boards or substrates. Furthermore, the circuit boards or substrates provided by these references have been found to be suitable for their intended purpose. However, there has been found to remain a further need for improvements in such circuit boards or substrates in order to further enhance signal transmission capabilities therein.

The present invention is based upon the realization that signal transmission in such circuit boards or substrates can be particularly enhanced by improved capabilities for signal transmission in a Z direction through the circuit board or substrate. More particularly, the present invention is based upon the realization that signal transmission in a Z direction through the circuit boards or substrates is desirable both for achieving signal transmission between locations spaced apart on a single X-Y signal plane and more preferably in a circuit board or substrate having multiple signal layers spaced apart from each other along a Z direction of the circuit board or substrate. Signal transmission between multiple signal layers of such a circuit board or substrate can obviously be carried out between the existing circuit layers. However, even with a single circuit layer as noted above, signal transmission in a Z direction may be employed by providing conductive elements spaced apart from the single signal layer of the circuit board or substrate as necessary for completing one or more circuits interconnecting locations spaced apart on the single circuit layer in a specified X-Y plane of the circuit board or substrate.

The present invention specifically contemplates signal transmission in a Z direction through the circuit board or substrate by electrical coupling means avoiding the need for one or more conductive elements extending in a Z direction through the circuit board or substrate. The invention preferably contemplates the use of capacitive coupling in this regard with signal pads being formed on signal layers spaced apart in a Z direction of the circuit board or substrate and a dielectric layer arranged therebetween having a suitable dielectric constant for achieving the desired coupling.

Similar couplings can be achieved for example in the form of inductive couplings as will be made apparent in the following description. However, regardless of the type of coupling contemplated for signal transmission in a Z direction through the circuit board, the invention eliminates the need for conductive elements extending in the Z direction through the circuit board.

Coupling transmission as contemplated by the present invention is thus controlled by electrical theory and equations set forth in greater detail below. Such theory has been employed in the past primarily in a mode directly contrary to that contemplated by the present invention. More specifically, capacitive coupling has been widely dealt with in the past but for the specific purpose of achieving "noise reduction" rather than for achieving specific signal transmission in a Z direction as novelly contemplated by the present invention.

As is made more apparent in the following description, the present invention thus employs electrical or signal transmission coupling in place of conductive elements in a Z direction such as plated through-holes and similar conductive elements such as blind and buried vias, for example. The terms "electrical coupling" and "signal transmission coupling" as well as the more specific term "capacitive coupling" are employed in the present invention to refer to circuit components achieving signal transmission in a Z direction between signal traces on spaced apart layers without an electrically conductive element or component interconnecting the signal traces.

It is accordingly an object of the invention to provide signal transmission circuitry in a circuit board or substrate with signal transmission in a Z direction being based upon electrical or signal transmission coupling and more specifically upon capacitive coupling rather than upon the use of Z directional conductive elements as employed in the prior art. Related objects of the invention contemplate methods for manufacturing such circuit boards or substrates as well as methods of their use.

More specifically, it is an object of the invention to provide a circuit board or substrate for mounting electrical components, the circuit board having conductive layers spaced apart and electrically insulated from each other, at least one circuit for transmitting AC signals from one layer to another in a Z direction through the circuit board, the AC signal transmitting circuit including a conductive transmitting or signal pad formed on a first conductive layer in the circuit board and a conductive receptor or receptor pad formed by a second conductive layer in the circuit board, the signal and receptor pads being interconnected with other circuitry components for completing necessary transmission of the AC signal, a dielectric layer being arranged between the signal and receptor pads with the thickness and dielectric constant of the dielectric layer and the respective areas of the signal and receptor pads being selected for developing effective signal transmitting coupling between the signal and receptor pads in order to transmit the AC signal from the signal pad to the receptor pad.

The circuit board or substrate referred to above specifically includes multilayer boards or substrates wherein the signal and receptor pads are arranged on existing signal planes spaced apart in a Z direction through the circuit board or substrate. However, the circuit board or substrate contemplated by the present invention can also make use of signal transmission coupling with a single circuit layer. In such a circuit board or substrate, one of the pads is arranged in the single signal layer with the other pad formed in a layer spaced apart from the single signal plane of the board and including necessary circuit components for transmitting a signal to another portion of the single signal layer. The most obvious configuration for such a circuit board or substrate with a single signal layer would be one wherein signal transmission coupling is employed in a Z direction at locations spaced apart in an X-Y plane formed by the single signal layer. Such a configuration would be able to facilitate signal transmission between different portions of the signal layer in the manner described above.

It is also a specific object of the invention to provide a method for forming a circuit board with components as summarized above and also a method for using such a circuit board or substrate. In a method of use, the circuit board or substrate is completed by the mounting of electrical components or devices thereon with the circuit coupling of the present invention providing necessary signal transmission therebetween.

Even more specifically, the present invention contemplates such a circuit board or substrate as well as methods of use or manufacture wherein electrical characteristics of the signal and receptor pads and the dielectric layer are selected to approach a resonant frequency condition in the AC signal transmitting circuit whereby capacitive reactance and inductive reactance approach equality with each other in order to optimize signal transmission coupling in the circuit board or substrate.

In this regard, capacitive reactance is defined by the equation (I)

$$X_c = \frac{1}{2\pi FC}$$

where F is frequency in megahertz and C is capacitance in farads;

inductive reactance is defined by the equation (II)

$$X_L = 2\pi FL$$

where F is frequency in megahertz and L is inductance in Henrys;

capacitance is defined by the equation (III)

$$C = \frac{AED}{\tau}$$

where A is the effective mutual area of the transmitting and receptor pads, D is Faraday's constant, E is the dielectric constant, and $\tau$ is the thickness of the dielectric layer forming the capacitor; and inductance is defined by the equation (IV)

$$L = 0.005 \ln (4h/d) \mu H/in$$

where ln indicates the natural logarithm, h is the distance of the circuit components above a ground plane and d is the diameter of the wire or conductor, the equation yielding inductance (L) in units of micro Henrys per inch, as indicated;

wherein capacitance and inductance are established in equations I and II with $X_C$ and $X_L$ being equal or approaching equality and the values of A, D, E, j, h, d (etc.) are preselected or calculated from equations III and IV.

Additional objects and advantages of the invention are made apparent in the following description having reference to the accompanying drawings.

DESCRIPTION OF THE PREFERRED EMBODIMENTS

Figure 1:
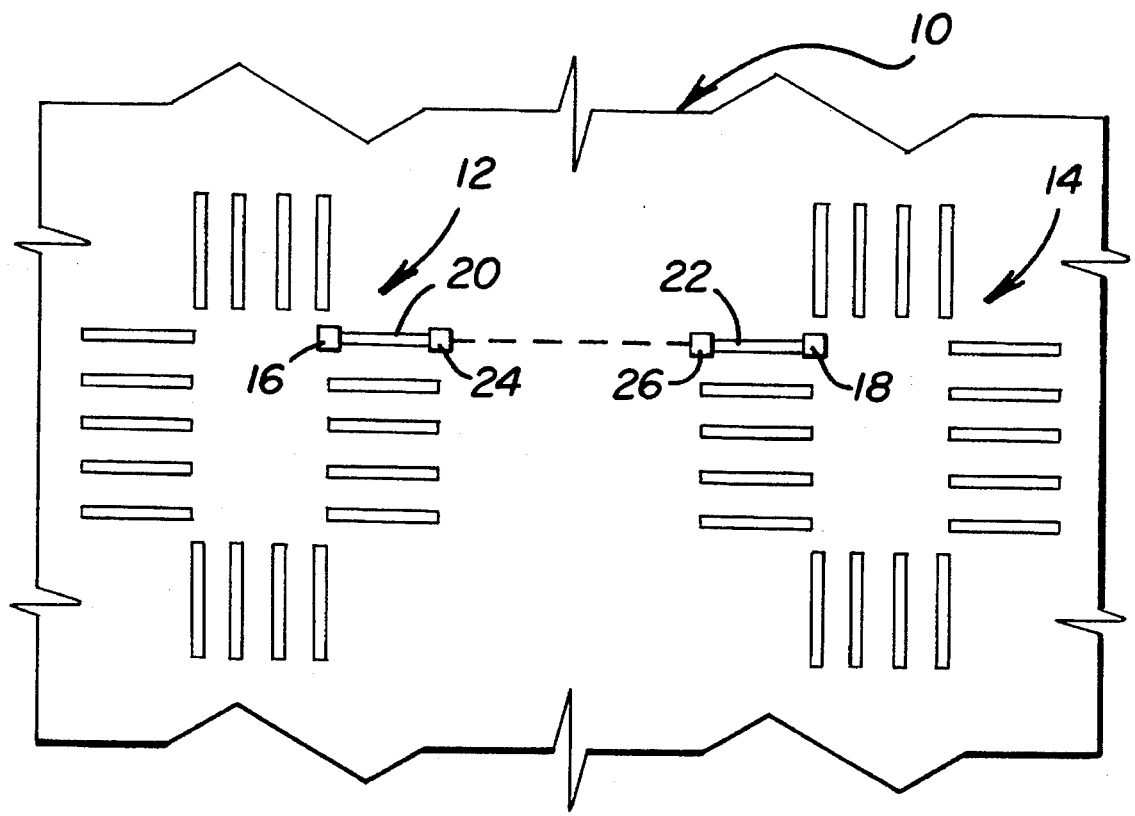
FIG. 1 is a plan view of a surface array on a PCB substrate illustrating signal traces in the form of conductive pads coupled with each other according to the present invention.

Various embodiments of a circuit board or substrate constructed according to the present invention are described below together with methods of making and using the circuit boards. As discussed above, the invention particularly contemplates the use of a signal transmission coupling or couplings and more specifically a capacitive coupling or couplings to form signal transmitting circuits within the circuit board. More specifically, signal transmission coupling according to the present invention is employed for signal transmission between signal components or signal layers spaced apart along a Z direction of the circuit board.

As contemplated by the present invention, signal transmission or capacitive coupling fulfills the requirements of a series resonant circuit in order to provide the necessary coupling effect contemplated by the invention. In this regard, every circuit includes resistance, inductance and capacitance. One or more parameters such as capacitance, for example, may be selected or determined to be of a certain value in order to utilize the series resonant capabilities of the circuit for transmitting a signal from one signal layer in a circuit board to another signal layer.

If desired, a characteristic or characteristics other than capacitance may be initially selected in the series resonant circuit. For example, inductance could be selected alone or in combination with another characteristic if it is a particularly critical factor. Suitable equations could then be solved for each circuit in order to establish the other electrical components in order to achieve the necessary requirements for a series resonant circuit.

It is important to note that the coupling features of the present invention and the series resonant circuit conditions described above apply only to AC signal transmission and not to DC signal transmission.

In attempting to demonstrate how to construct such a circuit, some very familiar formulas of the simplest type have been used in electronic theory to schematically provide a circuit made of copper or other material and containing some resistance. Accordingly, the circuit schematically includes resistance and inductance as a function of parasitic inductance produced by current passing along a conductor.

A resonant point or resonant frequency of a particular circuit, termed $F_o$, is reached when the capacitive reactance ($X_C$) of the circuit equals the inductive reactance ($X_L$) of the circuit. The reason this condition equals the lowest possible impedance in the circuit is that the capacitive reactance, by its nature, has a leading vector while the inductive reactance has a following vector as part of its character. Thus, with these two values being equal, they cancel each other out in terms of impedance developed in the circuit so that a low impedance connection can be developed for the circuit. Furthermore, the resistance remains constant and thus, if $X_C$ and $X_L$ cancel each other out, a low resistance can be achieved for a resonant connection between the various portions of the printed circuit board. This is valuable within the present invention since the resonant connection or something reasonably close thereto permits the transfer of energy between different layers of the printed circuit board without requiring a through-hole or other conductive element extending in a Z direction through the PCB. Thus, the present invention is generally intended to provide an acceptable level of signal transfer between layers of a printed circuit board while avoiding the drilling or formation of plated through-holes or other Z directional conductors for achieving signal transmission.

In applying the formula to a printed circuit board, the capacitor of the formula includes a dielectric layer of the printed circuit board and signal layers (or conductors) on opposite sides of the dielectric layer. In other words, individual pads arranged on different layers of the printed circuit board form the plates of the capacitor.

Within the formula referred to above, the total capacitance is the area times the dielectric constant times Faraday's constant divided by the thickness (of the dielectric layer) defines the capacitance generated between the plates or pads of the PCB. Within each circuit of the PCB, capacitive reactance is equal or approximately equal to inductive reactance. The length of the circuits and the configuration of the circuit (round conductors, square conductors, etc.) define the inductance of the circuit which is to be matched with the capacitive reactance of the circuit which is frequency dependent. This logic is broadly applicable to digital circuits since they tend to have a fixed frequency which does not vary during operation. That is, if a circuit has a 20 MHz clock, it will always be 20 MHz.

The condition of capacitive reactance equaling inductive reactance need not be perfectly balanced in order to employ the concept of the present invention. Rather, a balanced condition should be approached as closely as possible during design of the PCB circuits in order to minimize energy loss resulting from signal transfer between lays of a PCB without a connecting through-hole. Accordingly, it may be acceptable to permit some increased energy loss in order to achieve other desirable circuit characteristics. For example, if the above formula indicates that a ten mil pad is necessary in order to achieve the most efficient transfer at a certain frequency, the invention could still be employed if a nine mil pad were required for other design reasons, for example. The characteristics described above thus permit determination of various characteristics for a series resonant circuit as defined for the present invention according to generally standard electrical equations, as describe in greater detail immediately below.

Figure 5:
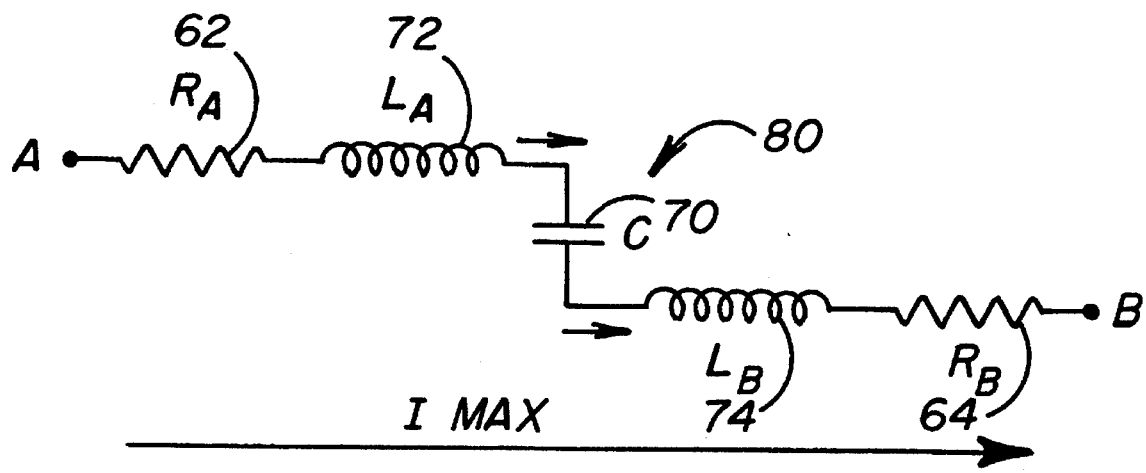
FIG. 5 is a schematic representation of an equivalent RLC series circuit for the single layer capacitive coupling device of FIG. 4.

A conventional RLC series circuit includes resistance and inductance on both sides of a capacitor between points A and B as illustrated in FIG. 5. For such a circuit, the effective resistance equals the resistance values on both sides of the capacitor and the effective inductance equals the inductance on both sides of the capacitor.

The above RLC series circuit is duplicated within the present invention with a capacitor is formed in the Z direction of a PCB substrate or the like by a dielectric layer positioned between conductive pads. It is noted again that capacitive coupling forms only one type of electrical or signal transmission coupling according to the present invention. Accordingly, signal transmission coupling in the Z direction of the substrate can also be achieved according to the present invention by other electrical means such as inductive coupling for example. However, the present invention is specifically described with reference to capacitive coupling as a preferred mode of coupling in a Z direction of a substrate.

Accordingly, conventional formulas for an RLC series circuit may be applied to the present invention. In such a circuit, inductive reactance and capacitive reactance can respectively be defined as $$X_L = 2\pi FL,$$

and $$X_C = 1/2\pi FC,$$

where F is frequency for example in megahertz or megacycles per second, C is capacitance in farads and L is inductance in Henrys.

The present invention necessarily contemplates a condition of series resonance where capacitive reactance $X_Z$ is equal to or approximately equal to inductive reactance $X_L$.

The resistant factors in the RLC series circuit tend to drop out for the condition of series resonance. In this regard, it may also be seen that total impedance for the RLC circuit may be written as $$Z = \sqrt{R^2 + (2\pi FL - 1/2\pi FC)^2}$$

where R is resistance in ohms and F, L and C are as described above.

Referring to the above equation, since $X_C$ substantially equals $X_L$, it may be seen that total impedance for the circuit is generally equal to total resistance R. Furthermore, since the circuit traces are formed from highly conductive copper, both resistance and impedance for the circuit tend to be very low resulting in relatively high efficiency which is of course desirable for such a circuit.

Thus, for condition of series resonance, where capacitive reactance substantially equals conductive reactance, $$2\pi FL = 1/2\pi FC.$$

For the same RLC series circuit, capacitance is defined by the equation $$C = AED/t$$

where A is the effective mutual area of the signal and receptor pads, D is Faraday's constant, E is the dielectric constant and t is the thickness of the dielectric layer forming the capacitor. At the same time, inductance for the RLC series circuit is defined by the equation $$L = 0.005 \ln (4h/d) \mu H/in.$$

where ln indicates the natural logarithm h equals the distance of the circuit components above a ground plane (an assumed condition) and d is the diameter of the wire or conductor, inductance being in units of micro Henrys per inch, as indicated.

According to the present invention, parameters for capacitive coupling in a circuit as described above may be determined from the preceding four equations. For example, inductance L can initially be calculated from the circuit length, diameter and distance of the circuit components from the ground plane. Also knowing the effective circuit frequency for the given RLC series circuit, the capacitance C can then be calculated from the equation $2\pi FL = 1/2\pi FC$. Given the capacitance C, the equation $C = AED/t$ can then be used to calculate the mutual area of the conductive pads for the capacitor, assuming a dielectric constant for a selected material to be used within the capacitor.

The above is only one of a number of approaches that can be employed according to the present invention. In other circuits, the order of calculations and the values to be assumed may change. However, an approach such as that outlined above can be used for any given RLC series circuit. Furthermore, it is noted that the preceding equations are based primarily upon Chapter 2 of a text by Henry W. Ott, Noise Reduction Techniques in Electronic Systems, Second Edition, Published John Wiley & Sons (1988). The preceding equations are a simplified version of relatively complex electronic values which must be considered in fully characterizing the RLC series circuit. The preceding formulas are believed to be sufficient for purposes of understanding the present invention. In addition, those skilled in the art of circuit design are readily capable of factoring in additional series circuit values for more accurately characterizing a circuit for purposes of the present invention.

It is to be understood that the formulas set forth herein are only a preferred mode for determining circuit parameters for signal transmission according to the present invention. Different formulas or models or variations and derivations of the above formulas or other formulas and models may be used in accordance with the present invention.

It is also noted again that capacitive coupling is a preferred mode of signal transmission coupling according to the present invention. However, other electronic forms of coupling may also be used in accordance with the present invention. For example, such coupling may be based upon capacitive and/or inductive coupling in particular.

Determination of circuit parameters from the above equations is further clarified by the following description of the drawings. Referring now to the drawings and particularly to FIG. 1, the present invention is contemplated for providing coupling means for completing one or more circuits on substrates of the type described above and particularly upon the printed circuit board (PCB) indicated at 10. Typically, on PCBs such as that indicated at 10 in FIG. 1 and in other devices contemplated by the invention, electrical couplings may be provided for relatively large numbers of circuits as will be apparent from the following description. However, a single circuit is illustrated in FIG. 1 for describing the construction and method of operation for the invention.

On the PCB 10 of FIG. 1, large numbers of individual leads are arranged in rectangular configurations at 12 and 14. Such lead arrangements are conventionally employed for surface mounting of a number of devices (not shown) which are well known to those skilled in the art of PCB manufacture and design. The rectangular device mounting cites 12 and 14 are illustrative of the large numbers of circuit traces to be formed upon different surfaces of the PCB. It is of course to be understood that circuit traces can be formed upon one or both surfaces of the PCB as well as upon one or more internal board surfaces (not shown) as will be apparent for example with reference to FIGS. 2–4, 6 and 7, for example.

In completing the construction of the PCB, it is necessary to provide interconnecting circuits between large numbers of circuit traces on the PCB in order to assure proper functioning of the devices mounted for example on the sites 12 and 14.

In order to illustrate the present invention, one such interconnection is illustrated in FIG. 1 for contact points 16 and 18 respectively included within the surface device mounting sites 12 and 14. For this purpose, the contacts 16 and 18 are respectively connected by conductive traces 20 and 22 with conductive pads 24 and 26 which are interconnected with each other in order to complete the circuit between the contacts 16 and 18.

It is further to be understood that with large numbers of components and circuit traces formed upon the exposed surfaces and internal surfaces of PCBs and like devices, space is at a premium on the PCBs, particularly upon the exposed surfaces adapted for surface mounting of large numbers of devices. For this reason, it is sometimes difficult to provide interconnecting conductors (not shown) on the same surface with the components or circuit traces to be interconnected. In some instances, circuitry must be completed between opposite surfaces of the PCBs or with different combinations of exposed and internal surfaces (not shown) within the PCB. Accordingly, it is common practice in the design of PCBs and similar substrate devices such as multi-chip devices and integrated circuits, for example, to employ conductive elements extending in a Z direction through the board for interconnecting circuit components on different surfaces of the board.

Figure 2:
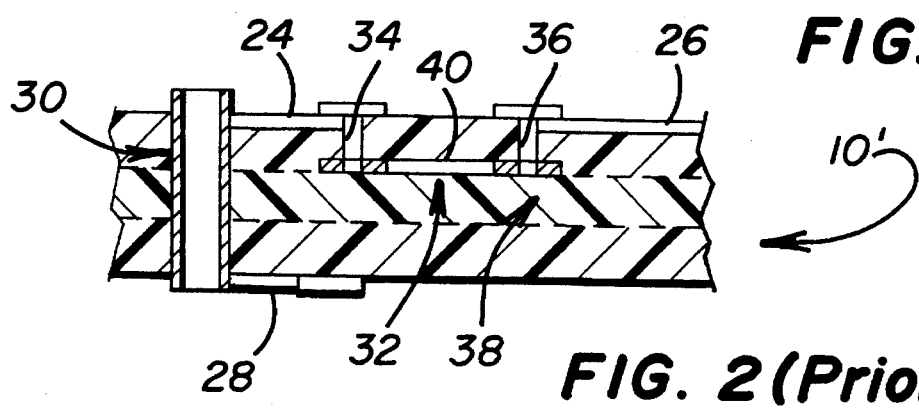
FIG. 2 is a sectioned view of a PCB substrate illustrating the prior art use of through-holes and blind vias for achieving the necessary coupling in the circuit of FIG. 1 without employing a conductive trace on the illustrated surface.

FIG. 2 is an illustration of one such prior art configuration wherein a PCB 10' includes circuit traces 24 and 26 on one surface of the PCB and an additional circuit trace 28 on the other exposed surface of the PCB. A conventional plated through-hole 30 is provided for interconnecting the circuit traces 24 and 28 on opposite sides of the board. The circuit traces 24 and 26 are also interconnected by a blind via assembly 32. The blind via 32 is of a conventional configuration including partial plated through-holes 34 and 36 extending between the upper surface of the PCB and an internal circuit trace layer 38. The partial plated through-holes 34 and 36 are respectively interconnected with the circuit traces 24 and 26 and commonly connected with another circuit trace 40 formed on the internal circuit trace layer 38.

Figure 3:
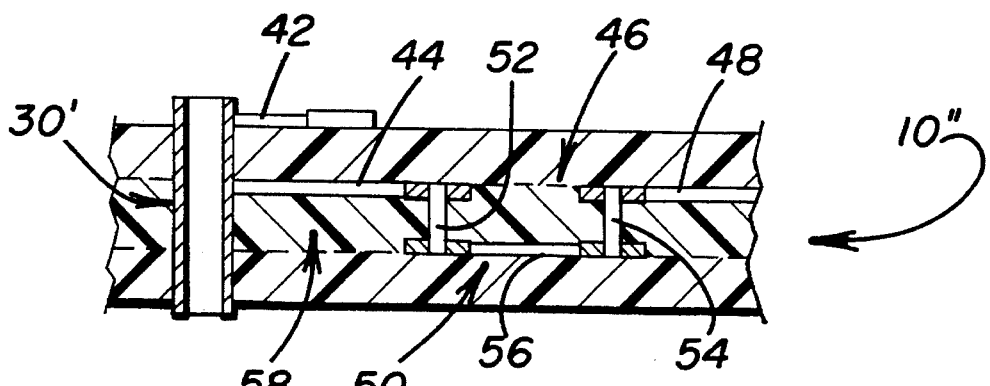
FIG. 3 is a similar prior art illustration of a through-hole and buried via for similarly achieving the necessary coupling in FIG. 1.

Yet another prior art configuration for a PCB 10" is illustrated in FIG. 3. Referring particularly to FIG. 3, a circuit trace 42 on the upper exposed surface of the PCB 10" is interconnected by a through-hole 30' with a circuit trace 44 arranged upon an internal circuit trace layer 46. The circuit trace 44 is also interconnected with another circuit trace 48 formed on the same internal circuit trace layer 46 by a buried via assembly 50 including partial through-holes 52 and 54 arranged completely internally within the PCB 10" for respectively interconnecting the circuit traces 44 and 48 with another circuit trace 56 formed on an additional internal circuit trace layer 58. Thus, the buried via assembly 50 of FIG. 3 is essentially similar to the blind via assembly 32 of FIG. 2 except that the buried via assembly is arranged completely internally within the PCB 10" while the blind via assembly is partially exposed or interconnected with one surface of the PCB 10'.

The prior art configurations of FIGS. 2 and 3 are provided to demonstrate prior art techniques for interconnecting components such as the conductive pads 24 and 26 of FIG. 1 and other circuit components arranged either upon exposed or internal surfaces of the PCB. It is to be noted that, in all instances, the prior art required the inclusion of a conductive element extending in a Z direction through the substrate of the PCB for completing the circuits of FIGS. 2 and 3. Such conductive elements include, for example, the through-holes 30 and 30' as well as the blind via assembly 32 of FIG. 2 and the buried via assembly 50 of FIG. 3.

Figure 4:
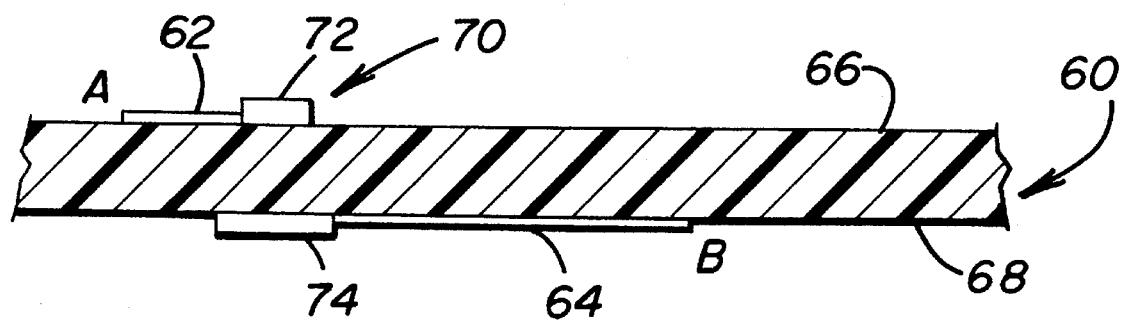
FIG. 4 is a sectioned view of a PCB substrate illustrating a single layer capacitive coupling device constructed according to the present invention.
Figure 6:
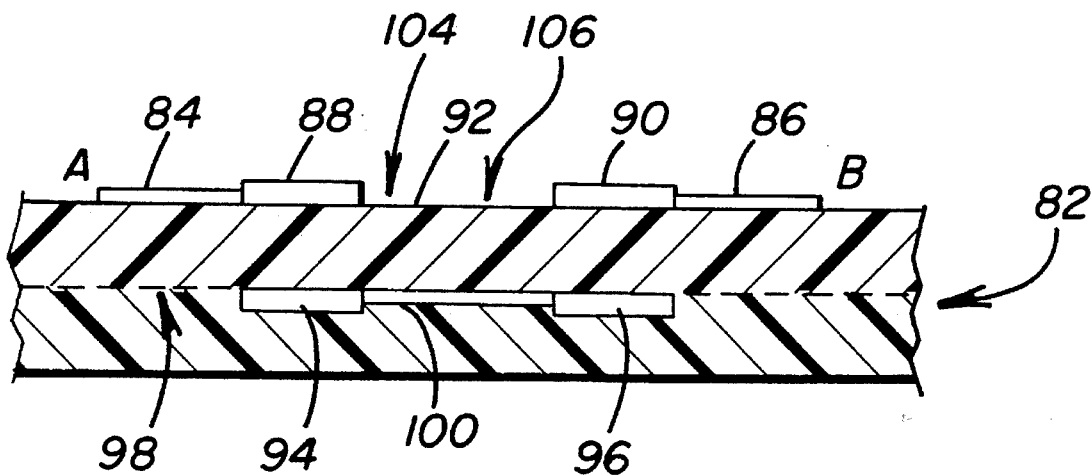
FIG. 6 is a sectioned view of a PCB substrate including two capacitive couplings and signal traces on separate layers of the PCB for interconnecting circuit components on a common surface.
Figure 7:
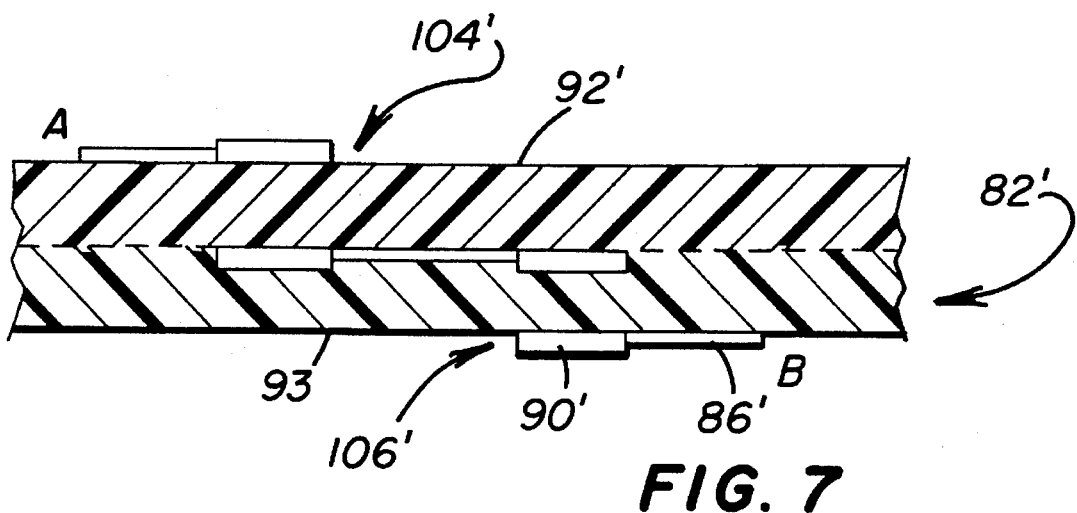
FIG. 7 is a view similar to FIG. 6 but with the capacitive couplings and signal traces arranged in stepped relation across the Z direction of the PCB.

FIGS. 4, 6 and 7 illustrate different configurations employing signal transmission couplings in accordance with the present invention for completing circuit interconnections such as that described above in FIG. 1.

Initially, FIG. 4 illustrates a single layer PCB 60 having circuit traces 62 and 64 arranged on opposite surfaces 66 and 68 of the PCB 60. A capacitive coupling constructed in accordance with the present invention is indicated at 70 for interconnecting the circuit traces 62 and 64. The capacitive coupling 70 includes conductive pads 72 and 74 arranged on opposite surfaces of the single layer 76 of the PCB 60. In order to complete the capacitive coupling 70, the layer 76 has a selected dielectric constant and a thickness selected in accordance with the equation set forth above for providing desired electrical characteristics.

In the simple single layer PCB of FIG. 4, the components described above are assumed to form a circuit component between points A and B. It is also to be assumed that a signal is passing in one direction between points A and B and, for purposes of illustration, it is assumed that the signal passes from A to B. Accordingly, the first conductive pad 72 is considered a signal pad with the other conductive pad 74 being a receptor pad. As discussed in greater detail elsewhere, the signal and receptor pads 72 and 74 are preferably of different sizes with the signal pad 72 having a smaller surface area than the receptor pad 74. Accordingly, the mutual area for the conductive pads 72 and 74 is the area of the smaller signal pad 72.

As will be discussed in greater detail below, the configuration and electrical parameters for the components of the capacitive coupling 70 are selected as described above with respect to equations I–IV for achieving desired capacitive coupling between A and B.

It is to be noted that the capacitive coupling 70 of FIG. 4 has relatively severe limitations since its capacitive or dielectric layer 76 must be both thin enough to achieve proper capacitive functioning between the signal and receptor pads 72 and 74 while also being sufficiently thick in order to provide structural integrity as a PCB. However, the embodiment of FIG. 4 does represent the simplest capacitive coupling concept of the invention. It will also be apparent, for example with reference particularly to FIG. 7 that electrical interconnection between the circuit traces 62 and 64 may be better achieved by the use of stepped capacitive couplings as described below for achieving desired signal communication between the signal traces 62 and 64 while still permitting proper selection of the PCB substrate structure.

The manner in which equations I–IV may be employed for determining characteristics and parameters of the capacitive coupling assembly of FIG. 4 may be better seen with reference to the equivalent RLC series circuit of FIG. 5. That equivalent circuit is indicated at 80 and similarly includes circuit points or termini A and B.

Referring to FIG. 5 in combination with FIG. 4, resistance and inductance for the circuit trace 62 and signal pad 72 in combination are respectively indicated at $R_A$ and $L_A$. Similarly, resistance and inductance for the circuit trace 64 and receptor pad 74 in combination are represented respectively at $R_B$ and $L_B$. Capacitance for the capacitive coupling 70 is indicated at C in FIG. 5. With simplifications as discussed above, total resistance in the circuit AB is thus equal to $R_A+R_B$ while total inductance is equal to $L_A+L_B$. With the condition of series resonance being assumed within the circuit AB as described above, the values of resistance in the circuit become negligible so that the circuit characteristics and parameters may be determined from equations I–IV as described above.

Figure 8:
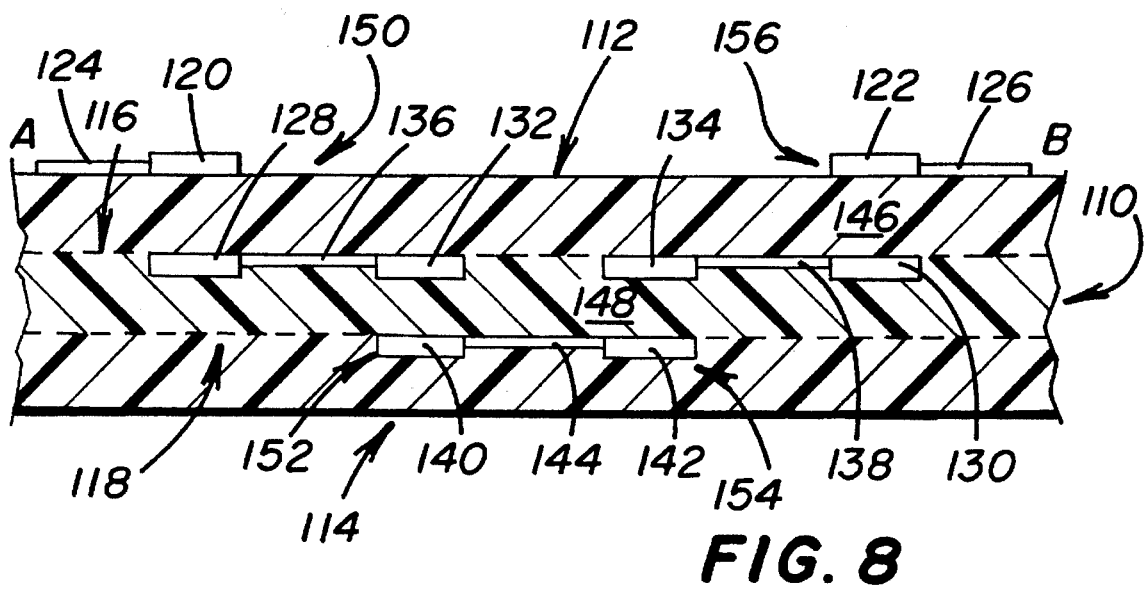
FIG. 8 is a view similar to FIG. 7 showing multiple capacitive couplings and signal traces arranged in stepped relation across the Z direction of the PCB.

Numerous variations are of course possible for signal transmission couplings or more preferably capacitive couplings constructed and employed according to the present invention. For example, it may be seen that the capacitive coupling 70 of FIG. 4 functions in generally the same manner as a plated through-hole (see 30 and 30' of FIGS. 2 and 3). By contrast, FIGS. 6–8 illustrate relatively more complex arrangements of capacitive couplings as described below for achieving functions corresponding to the prior art functions achieved by buried vias and blind vias, for example.

Referring to FIG. 6, another PCB is indicated at 82 with conductive traces 84 and 86 respectively interconnected with points A and B and also with conductive pads 88 and 90. All of the above components are formed or arranged upon an exposed surface 92 of the PCB. Additional conductive pads 94 and 96 are arranged on an internal circuit layer 98 of the PCB in respective register with the conductive pads 88 and 90 while also being interconnected by an additional circuit trace 100 also formed on the internal circuit layer 98. A PCB layer 102 extending between the paired conductive pads has a selected dielectric constant and thickness as described above.

In the configuration of FIG. 6, the combination of the conductive pads 88 and 94 together with the dielectric layer 102 form a first capacitive coupling according to the present invention with the other combination of conductive pads 90 and 96 forming a second capacitive coupling 106 also in combination with the same dielectric layer. Generally, the capacitive couplings 104 and 106 function in combination to achieve the same purpose as the blind via of FIG. 2. Assuming that the signal passes from A to B in FIG. 6, the conductive pads 88 and 96 function as signal pads while the conductive pads 94 and 90 function as receptor pads in accordance with the preceding description.

Another PCB is illustrated at 82' in FIG. 7. Substantially the same components described above with reference to FIG. 6 are also employed in FIG. 7. Accordingly, similar primed numerals are employed in FIG. 7. The primary difference in FIG. 7 is that the conductive pad 90', the signal trace 86' and point B are arranged on an opposite exposed surface 93 of the PCB 82' opposite its first exposed surface 92'. The capacitive couplings 104' and 106' of FIG. 7 thus function in essentially the same manner as described above with reference to FIG. 6. However, in FIG. 7, the capacitive couplings 104' and 106' form a stepped coupling configuration between the opposite exposed surfaces 92' and 93 of the PCB 82'. Thus, the capacitive couplings 104' and 106' of FIG. 7 function in combination in substantially the same manner as the through-holes 30 and 30' of FIGS. 2 and 3. Otherwise, the components and parameters in the configuration of FIG. 7 may also be determined in accordance with equations I–IV as set forth above.

Referring now to FIG. 8, still another PCB is indicated at 110 with exposed surfaces 112 and 114 and internal signal layers 116 and 118. Here again, circuit termini A and B are both indicated on the upper exposed PCB surface 112 and are interconnected with conductive pads 120 and 122 by means of signal traces 124 and 126 respectively. Conductive pads 128 and 130 are arranged on the internal circuit layer 116 in register with conductive pads 120 and 122 while being interconnected with additional conductive pads 132 and 134 on the same internal layer 116 by means of signal traces 136 and 138. Additional conductive pads 140 and 142 are arranged on the other internal signal layer 118 in register with the conductive pads 132 and 134 while also being interconnected by means of a signal trace 144 on the internal signal layer 118. Layers 146 and 148 of the PCB 110 are formed from dielectric material having a selected dielectric constant as described above. In this configuration, capacitive couplings 150, 152, 154 and 156 are respectively formed by the conductive pads 120 and 128, 132 and 140, 142 and 134, and 130 and 122. Either of the dielectric layers 146 or 148 are included within each of the capacitive couplings in accordance with the preceding description. In this configuration, the four capacitive couplings 150–156 formed a stepped arrangement of capacitors interconnecting the series termini A and B. At the same time, the two intermediate capacitive couplings 152 and 154 function similarly as the buried via assembly 50 of FIG. 4.

FIGS. 6 and 8 together with FIG. 4 illustrate a variety of configurations possible for the capacitive couplings of the present invention. Still other configurations are of course possible. At the same time, it is to be noted that each of the PCBs illustrated in FIGS. 4 and 6–8 and similar substrate devices will include relatively large numbers of circuits such as those illustrated in the above figures. In accordance with the present invention, it is of course essential to determine the configuration and parameters for each of the circuits in accordance with equations I–IV set forth above.

Also as illustrated in FIGS. 6–8, it is possible to employ stepped arrangements of multiple capacitive couplings in series to achieve greater design versatility. However, in that regard, it is also to be understood that as the number of capacitors arranged in series within a single circuit increases, the capacitance for each of the capacitors must be substantially increased. This is demonstrated for capacitors in series by the formula $$1/C = 1/C_1 + 1/C_2 + 1/C_3$$

where C is the composite capacitance for the entire series circuit and $C_1$, $C_2$, $C_3$, etc. represent the individual capacitance values for the capacitors arranged in series.

As noted above, the present invention also contemplates a method of forming substrate devices such as PCBs with one or more capacitive couplings as illustrated in FIGS. 4 and 6–8. It is believed that such a method will be readily apparent to those skilled in the art from the preceding description. However, the method is briefly described below in order to assure a complete understanding of the invention.

Initially, the circuit components for the capacitive couplings are arranged or formed upon the respective layers of the device substrates as illustrated in FIGS. 4 and 6–8. The circuit components of the conductive couplings and the other components on the substrates are preferably formed in accordance with existing PCB technology. For example, the conductive components may be formed, for example, by electrodeposition, electrodeless deposition, photoimaging techniques or screening techniques and the like. The capacitive layers in the substrate may also be formed by conventional techniques such as lamination as commonly employed within PCB manufacture.

The characteristics and parameters for the circuit components are selected in accordance with equations I–IV as discussed above. In this regard, the invention contemplates assuming certain parameters normally based upon availability of particularly critical components in the circuits. In that regard, critical components may include either surface area of the conductive pads, that is the signal and receptor pads, the dielectric constant and thickness of the dielectric layers or even the inductance in the circuits. The remaining parameters may then be determined in accordance with equations I–IV.

In a conventional circuit configuration, it may be assumed only for purposes of example that the circuit length and circuit diameter or dimensions are known as well as the circuit frequency. The availability of these characteristics permits calculation of inductance (L) from equation IV as set forth above. Availability of inductance (L) and frequency (F) permits calculation of capacitance from equations I and II in combination.

Given the capacitance, the areas of the signal and receptor pads (or their mutual area as described above) is then determined from equation III. However, it is again noted that this particular sequence of calculations is only representative and is not intended to define or limit the invention. As noted above, other values or parameters may be initially selected with the remaining values then being determined in the same manner from equations I–IV.

It is important to remember that the present invention provides a functional substitute for plated through-holes, blind or buried vias or other Z direction conductive elements. At the same time, the signal transmission or capacitive coupling concept of the present invention is intended to replace the technology of plated through-holes and blind or buried vias with the technology of capacitive coupling in a manner simplifying and facilitating formation of circuits within the PCB.

This may be a difficult design consideration in that all of the pads in the PCB must be designed to be of the fight size for response to frequencies required within the PCB, conductors in the PCB also being designed for the proper inductive response in order to achieve the necessary balance. As noted elsewhere herein, it is particularly contemplated that design considerations for large numbers of circuits on a PCB or other substrate may best be carried out by means of a preconceived computer program. However, the specific content of such a computer program is not a portion of the present invention and accordingly is not described in greater detail herein.

It is further contemplated that one of the conductive pads in different layers of the PCB be larger than the other pad in order to assure the absorption of all energy from the signal pad, for example, rather than having a portion of the energy transferred to pads on the same layer. For this reason, the dielectric layer is preferably suitably thin, probably quite thin and more preferably very thin in order to employ the concept of the present invention. At the same time, utilization of the concept of the present invention is enhanced by maximizing the dielectric constant for the dielectric layer. Accordingly, ceramics and other known high dielectric constant materials, capable of being machined to a thin dielectric layer, may be particularly desirable within the present invention. Generally, parameters such as those set forth above are believed to be possible within existing printed circuit board technology for achieving the purpose of the present invention. In addition, it is also believed possible to employ the capacitive coupling concept of the present invention in components other than printed circuit boards, such as multi-chip modules, hybrid circuits, etc. while realizing similar advantages of replacing plated through-holes or blind and varied vias.

Furthermore, even though capacitive coupling elements are designed for the most efficient signal transfer possible, it is to be realized that they may not achieve the exact or required proportions for achieving series resonance as defined above. However, they can still be employed within the concept of the present invention if they at least approach the condition of a series resonant circuit.

In this regard, capacitive coupling has long been recognized as a nuisance factor in the design of all types of printed circuit boards and similar electronic components. Considerable time has been devoted to the shielding and/or separation of conductors, pads and spaces in order to prevent undesirable signal generation or transmission. By using this idea to its maximum advantage, the present invention contemplates the positive use of capacitive coupling for eliminating the use of plated through-hole and buried or blind vias.

Undesirable capacitive coupling referred to above in the prior an has almost always been characterized in terms of reducing noise. In this regard, works by Henry Ott and others (as noted above) have discussed means for reducing capacitive coupling. Some of the means for achieving reduced capacitive coupling in the prior art are obvious, including separating the signal source and signal receiver. By contrast, in the present invention, it is intentionally contemplated to move the signal source and signal receiver (that is, the capacitive coupling plates or signal plate and receptor plate) closer together. Similarly, the level of signal transmission or capacitive coupling can also be varied by changing the dielectric constant for the material between the plates. Furthermore, the amount of capacitive coupling or the degree of signal transmission can also be changed by varying the areas of the plates.

Typically, this invention is concerned with the mutual area of the two capacitor plates (or conductors which either cross or interface with each other in a printed circuit board or the like). However, if one pad is preferably formed to be smaller than the other, the capacitance will depend primarily upon their mutual area, that is, generally the area of the smaller plate.

Practically speaking, it is difficult but not impossible to achieve absolute levels of capacitive coupling (either a maximum level for signal transmission or elimination thereof for avoiding signal transmission). For example, well known electronic theory provides for a lack of interference in surrounding conductive areas by reducing the size of a pad by 4 to 20 times the thickness of the dielectric in order to curtail or effectively eliminate unwanted radiation from the edge of that particular plate. Based upon such theories, it will probably be necessary in the present invention to similarly avoid interference in conductive plates, for example on the same layer of the PCB as the transmitting plate. In other words, it is desirable to minimize signal transfer between conductive elements on the same layer of the board while maximizing signal transfer between plates on different levels of the boards.

Shielding is one technique employed for minimizing capacitive coupling and, accordingly could be used within the present invention for limiting capacitive coupling between plates on the same layer of the board while avoiding shielding between plates on different layers of the board where capacitive coupling is desired.

It also to be realized that inductive coupling occurs within such circuits and has not been addressed herein. Inductive coupling always occurs as a result of magnetic fields generated by the flow of current. Some inductive coupling is thus going to take place and it an important part of the operation of the circuits contemplated by the present invention; however, inductive coupling is not considered to be the key for capacitive coupling of signals according to the present invention.

The use of pads of different size may be preferable because the staggering of the sizes or edges of the pads is a recognized means for attempting to shield emissions from the pads further definition will be required in this area. However, it is now contemplated that the use of pads of different sizes is merely a preferred embodiment of the invention for optimizing signal transfer between plates on different layers and minimizing signal transmission between plates on the same layers. In theory, forming the receptor pad with a larger area enables it to capture more of the line of flux created by the signal pad. In this manner, it is contemplated that the electrostatic flux created by the signal pad will be more completed captured by the receptor pad without allowing signal leakage to other conductors on the same layer as the signal pad.

Obviously, spacing is critical both as to separation between the signal and receptor pads as well as separation of the signal pad from other conductive pads on the same layer.

Generally, by optimizing circuit characteristics such as those discussed above, it is believed possible to more closely pack a number of circuits onto a printed circuit board while at the same time avoiding interference or undesirable signal transmission as defined above.

In summary, the prior art references dealing with capacitive coupling tend to be complex compared to the present invention where it is desired to generally duplicate the effect of a straight wire or conductor by using AC current capabilities to achieve capacitive or signal transmission coupling.

There are many advantages for this basic concept of the invention. Initially, the use of capacitive coupling for transmitting a signal between different layers of a printed circuit board or like substrate avoids the expensive and relatively complex operations necessary for the use of capacitive coupling provides a potentially less expensive and less complex means for achieving signal communication as least equal in quality to that achieved by blind or buffed vias.

In forming both plated through-holes and blind or buffed vias as required in the prior art, it has been necessary to form a conductor passing in a Z direction through all or a substantial portion of the board. At the same time, substantial area throughout the entire depth of the board is dedicated to the conductor forming the signal transmitting component. By contrast, the capacitive coupling concept of the present invention permits the coupling to be formed by techniques involving only individual layers of the board (in respective X-Y planes) rather than a component passing in the Z direction as with the prior art through-holes and blind or buried vias.

The use of capacitive coupling thus provides an improved capability for forming very thin multi-layer circuits in printed circuit boards and the like. It is also possible to form very dense multi-layer circuits having various components arranged on different layers of the board. These components, on different surfaces of the board, do not have to be arranged in line with each other (as with the prior art conductors passing in the Z direction through the board).

Advantages such as those summarized above are immediately apparent based upon present technology. As the advantages of capacitive coupling become better known and are available during design of significant board improvements, substantial improvements and benefits are expected in the future.

The invention is preferably concerned with dielectric layers of minimal thickness. This thickness is of course interdependent upon the dielectric constant of the layer. Possibly a ½ mil thickness is typical for existing dielectric materials such as ceramics, etc. These very thin dielectric layers have a significant advantage of achieving capacitive coupling as noted above. At the same time, however, the thin dielectric layers also raise the possibility of "cross-talk" or noise generation between circuit components on different layers of the printed circuit board. In other words, it is necessary not only to consider noise generation between circuits or components on a single layer of the board but also between components spaced apart on different layers only by a thin dielectric layers which are intentionally provided with signal transmitting capabilities (that is, being very thin and having a high dielectric constant.) Special design considerations may be required in this regard. For example, many circuit components on adjacent signal layers separated only by signal transmitting (dielectric) layers may preferably be generally parallel with each other so that they do not tend to cross each other. Design considerations of this type may be necessary to further prevent unwanted signal transmission in the boards. Thus, it is possible for the present invention to increase complexity of circuit designs on printed circuit boards and the like while avoiding through-hole formation and possibly increasing circuit density. The optimum design of the invention will probably require the use of dielectrics with the thinnest possible cross-section and the maximum dielectric constant. For example, a material having a dielectric constant of 200 with a thickness measured in Angstroms would be very desirable. However, practical limitations may require greater thicknesses for the dielectric, the use of lower dielectric constants, etc.

In contrasting the invention again with the prior art, the prior art has arranged circuit components close to each other merely for the purpose of compactness, introducing the possibility of noise transmission at the same time. Accordingly, the prior art has intentionally avoided the use of high dielectric constant material in order to avoid noise transmission. For the same reason, the prior art has avoided the use of relatively large area pads of the type contemplated by the present invention for the dual reasons that the large area pads would take up more space than necessary and at the same time introduce noise generation. Finally, the prior art has employed capacitors to provide AC signal transmission of the type contemplated by the present invention. However, those capacitors have been employed in the prior art only on a given surface in printed circuit boards or the like. Capacitors can also be provided as surface mounted devices on the boards. In any event, it is again noted that the capacitors of the present invention are replacing conductors extending in the Z direction of the board.

An additional novel feature of the present invention is that the capacitive coupling of the present invention is formed on different layers of the board and replaces a conductor extending in the Z direction while at the same time possibly replacing another capacitor on a surface of the board. The invention may be most suitable for replacing small capacitors having for example 20, 30 or 40 picofarad capacitance. In addition, the capacitors may be limited as to frequency response.

At the same time, the invention is characterized by a loss of signal level on the reception side of the board. Generally, this signal loss results in a reduced voltage level for the signal in the receptor pad as compared to the signal pad. Accordingly, the invention can be designed allowing for a necessary voltage drop during each step of capacitive coupling with a satisfactory signal level being provided in a last signal layer.

Suitable applications for the invention include printed circuit boards, possibly integrated circuits and other components such as multi-chip devices and other devices generally characterized by multiple signal carrying layers within the devices. A typical printed circuit board may contain thousands of through-holes or buried and blind vias. A large number, possibly most, of these full or partial through-holes are employed for AC signal transmission and are thus subject to placement by the capacitive coupling concept of the present invention. Here again, other considerations such as frequency response and the like must be considered in order to determine if the through-holes can actually be replaced by capacitive coupling. However, the use of capacitive coupling does provide a great advantage in the design of such components.

The present invention is generally contemplated for use with at least at two layer board, that is a sheet of dielectric having signal traces on opposite sides. However, the invention can also be used on single layer or single sided boards which simply include an epoxy laminate substrate with one signal trace on one side. Even though such a board does not have multiple layers, signal pads could be formed in spaced apart relation from the single conductive layer in order to permit capacitive coupling according to the present invention. In other words, the use of such pads would in effect provide an additional layer in the board so that it would satisfy the characteristics of a board having two or more layers.

The invention is probably most useful in "multi-layer" boards having three conductive layers or more. Boards with two, 4, 6 and 8 conductive layers are common with odd numbers of layers such as 3, 5 and 7 being available but little used. Apparently, most board designers employ symmetry with pairs of conductive layers employed for signal transmission. A typical printed circuit board may have four layers including internal power and ground planes with conductive layers on both surfaces and about 95% of the through-holes may be intended for AC transmission and could be replaced by the present invention.

A preferred design for the present invention may be an ultrathin four layer printed circuit board having internal power and ground planes with conductive or signal layers on each surface. In such a board, the use of complete or partial through-holes can be avoided by the present invention except for a very limited number required for DC signal transmission. As noted above, this could greatly simplify and reduce the cost for manufacturing such board.

With relatively thick PCBs, the present invention could be employed for signal transmission between opposite sides of the board but it would be necessary to employ multiple or "repeater" capacitive couplings in order to conduct the signal between the opposite layers of the board through the intermediate conductive layers. In such a design, tradeoffs for using the present invention would involve the number of repeater capacitive couplings versus the cost and complexity for designing a single through-hole passing entirely through the board.

PCBs commonly include power and ground planes but this is not essential; possibly portions of signal layers could be designed for carrying power without specific power and ground planes. Often, specific functions are carried out on individual layers or on sections of layers. For example, it is common to arrange clock traces in a loaded portion of the board simply to facilitate design.

As for using the invention to replace through-holes, it is again noted that the through-holes may be complete (that is, extending from one side of the board to the other) or partial (as a blind or buried via). These need not be plated through-holes only but can be conductors either threaded through the board in the Z direction or even plated in recesses during formation of a single layer. In any event, the capacitive coupling of the present invention is intended to replace conductive elements extending through the board in a Z direction.

Capacitive coupling is broadly referred to in connection with the present invention as signal transmission coupling since capacitive coupling is only a preferred method of signal transmission coupling for achieving signal communication in the Z direction of a circuit board according to the invention. As noted above, it might also be possible to employ inductive coupling in the same way and generally by solving the same formulas set forth in the theoretical discussion above.

The present invention may be best adapted to certain operating frequencies in the PCB. The question of suitable operating frequencies may be best understood by equating it to the requirement for balancing inductance and capacitance within each circuit. This may be difficult at lower frequencies, for example, because of the requirement for larger capacitors, etc. in order to satisfy the equation set forth above. Accordingly, such requirements may make capacitive coupling most feasible in certain frequency ranges.

Referring again to the formula set forth above, this suggests defining the invention in terms of a method for formulating a series resonant circuit suitable for use in achieving capacitive coupling. Such formulations have been widely employed in the past for designing series resonant circuits. However, in terms of the present invention, these formulas have been primarily for avoiding capacitive coupling. Accordingly, it would be possible here to base novelty on the use of such a method for formulating a series resonant circuit in circuit components extending between different layers of a circuit board or the like.

Referring again to the above formulations, such a process could involve the following steps:

(1) calculate inductance
(2) make $X_C$ and $X_L$ equal;
(3) calculate capacitance; and
(4) calculate pad area, dielectric constant, etc.

The above steps may be carried out for each circuit on the printed circuit board and would commonly require a suitable computer program for accomplishing this design function in a printed circuit board with large numbers of components. However, formulations of similar complexity are commonly employed in other design features of printed circuit boards.

The method set forth above may be further broadened to commence with a selected controlling factor or factors such as pad size, inductance, capacitance, dielectric constant, dielectric thickness, etc. and then carrying out the calculations set forth in the above steps.

The use of the above formulations and the balancing of inductance and capacitance to achieve as close as possible to a series resonant circuit may result in the capacitive coupling circuit being even more efficient than a metal conductor circuit which it replaces. For example, this may be particularly true since the metal conductor circuit is typically designed without consideration for the amount of capacitance and/or inductance, at least to the extent those values are optimized in the present invention.

Accordingly, there have been discussed above a number of embodiments of circuit boards or substrates employing signal transmission coupling or more specifically capacitive coupling for transmitting signals in a Z direction through the circuit board or substrate and between spaced apart signal layers in order to achieve AC signal transmission without the need for conductive elements extending in the Z direction between the signal planes. There have also been described one or more methods for forming and for using such circuit boards. Variations are also possible in addition to those specifically described above. Thus, the present invention is defined only by the following claims which are further exemplary of the invention.

What is claimed is:

1. A circuit board for mounting electrical components and having conductive layers spaced apart and electrically insulated from each other, and at least one circuit for transmitting AC signals from one layer to another, the AC signal transmitting circuit comprising a conductive signal pad formed by a first conductive layer in the circuit board and adapted for coupling with means for generating an AC signal, a conductive receptor pad formed by a second conductive layer in the circuit board and adapted for coupling with means for responding to the AC signal, and a dielectric layer arranged between the signal and receptor pads, the thickness and dielectric constant of the dielectric layer and the respective areas of the signal and receptor pads being selected for developing effective capacitive coupling between the signal and receptor pads in order to electrostatically transmit the AC signal from the signal pad to the receptor pad, the signal and receptor pads and the dielectric layer having electrical characteristics approaching a resonant frequency condition in the AC signal transmitting circuit whereby capacitive reactance and inductive reactance approach equality in order to optimize capacitive coupling.

2. The circuit board of claim 1 further comprising additional conductive circuit means formed on the first and second conductive layers, the thickness and dielectric constant of the dielectric layer, the respective areas of the signal and receptor pads also being selected in combination with spacing of the additional conductive circuit means front the signal and receptor pads for minimizing capacitive coupling with the additional conductive circuit means.

3. The circuit board of claim 2 wherein the additional conductive circuit means on the first and second conductive layers form additional signal and receptor pads separated by additional dielectric layers for developing effective capacitive coupling between sets of the additional signal and receptor pads on the first and second conductive layers also for electrostatic transmission of AC signals therebetween.

4. The circuit board of claim 1 wherein the circuit board is of a multi-layer type having at least a third conductive layer and further wherein the additional conductive circuit means on the adjacent pairs of the first, second and third conductive layers form additional signal and receptor pads separated by additional dielectric layers for developing effective capacitive coupling between sets of the additional signal and receptor pads on the first and second conductive layers for electrostatic transmission of AC signals therebetween.

5. The circuit board of claim 1 wherein:

capacitive reactance is defined by the equation (I)

$$X_c = \frac{1}{2\pi FC}$$

where F is frequency and C is capacitance;

inductive reactance is defined by the equation (II)

$$X_L = 2\pi FL$$

where F is frequency and L is inductance;

capacitance is defined by the equation (III)

$$C = \frac{AED}{\tau}$$

where A is the effective mutual area of the transmitting and receptor pads, D is Faraday's constant, E is the dielectric constant, and $\tau$ is the thickness of the dielectric layer; and inductance is defined by the equation (IV)

$$L = 0.005 \ln (4h/d) \mu H/in.$$

where ln indicates the natural logarithm for the value 4h/d, where h is the distance above a ground plane, and d is the equivalent diameter of a conductor;

wherein capacitance and inductance are established in equations I and II with $X_C$ and $X_L$ being equal or approaching equality and the values of A, D, $\tau$, $I_N$, h (etc.) are preselected or calculated from equations III and IV.

6. The circuit board of claim 5 wherein capacitance is initially selected followed by calculation of capacitive reactance from equation I with inductive reactance being assumed equal to or approaching equality with capacitive reactance.

7. A method of forming a circuit board for mounting electrical components and having conductive layers spaced apart and electrically insulated from each other, and at least one circuit for transmitting AC signals from one layer to another, comprising the steps of forming a conductive signal pad and conductive receptor pad on surfaces of the circuit board spaced apart in a Z direction with a dielectric layer therebetween, the conductive signal pad being adapted for coupling with means for generating an AC signal, coupling the conductive signal pad with means for generating an AC signal, coupling the conductive receptor pad with means for responding to the AC signal, selecting the thickness and dielectric constant of the dielectric layer and the respective areas of the signal and receptor pads for developing effective capacitive coupling between the signal and receptor pads in order to electrostatically transmit the AC signal from the signal pad to the receptor pad, and selecting electrical characteristics of the signal and receptor pads and the dielectric layer to approach a resonant frequency condition in the AC signal transmitting circuit whereby capacitive reactance and inductive reactance approach equality in order to optimize capacitive coupling.

8. The method of claim 7 further comprising the step of forming additional conductive circuit means on the first and second conductive layers, the thickness and dielectric constant of the dielectric layer, the respective areas of the signal and receptor pads also being selected in combination with spacing of the additional conductive circuit means from the signal and receptor pads for minimizing capacitive coupling with the additional conductive circuit means.

9. The method of claim 8 wherein the additional conductive circuit means on the first and second conductive layers form additional signal and receptor pads separated by additional dielectric layers for developing effective capacitive coupling between sets of the additional signal and receptor pads on the first and second conductive layers also for electrostatic transmission of AC signals therebetween.

10. The method of claim 7 wherein the circuit board is of a multi-layer type having at least a third conductive layer and further wherein the additional conductive circuit means on the adjacent pairs of the first, second and third conductive layers form additional signal and receptor pads separated by additional dielectric layers for developing effective capacitive coupling between sets of the additional signal and receptor pads on the first and second conductive layers for electrostatic transmission of AC signals therebetween.

11. The method of claim 7 wherein:

capacitive reactance is defined by the equation (I)

$$X_c = \frac{1}{2\pi FC}$$

where F is frequency and C is capacitance;

inductive reactance is defined by the equation (II)

$$X_L = 2\pi FL$$

where F is frequency and L is inductance;

capacitance is defined by the equation (III)

$$C = \frac{AED}{\tau}$$

where A is the effective mutual area of the transmitting and receptor pads, D is Faraday's constant, E is the dielectric constant, and $\tau$ is the thickness of the dielectric layer; and inductance is defined by the equation (IV)

$$L = 0.005 \ln (4h/d) \mu H/in.$$

where ln indicates the natural logarithm for the value 4h/d, where h is the distance above a ground plane, and d is the equivalent diameter of a conductor;

wherein capacitance and inductance are established in equations I and II with $X_C$ and $X_L$ being equal or approaching equality and the values of A, D, $\tau$, $I_N$, h (etc.) are preselected or calculated from equations III and IV.

12. The method of claim 11 further comprising the step of initially selecting capacitance for the AC signal transmitting circuit and then calculating capacitive reactance from equation I with inductive reactance being assumed equal to or approaching equality with capacitive reactance.

13. A circuit board for mounting electrical components and having conductive layers spaced apart and electrically insulated from each other, and at least one circuit for transmitting AC signals from one layer to another, the AC signal transmitting circuit comprising a conductive signal means formed by a first conductive layer in the circuit board and adapted for coupling with means for generating an AC signal, a conductive receptor means formed by a second conductive layer spaced apart in a Z direction from the first conductive layer in the circuit board and adapted for coupling with means for responding to the AC signal, a dielectric layer arranged between the signal and receptor means, characteristics for the conductive signal means, the conductive receptor means and the dielectric layer arranged therebetween being selected for developing effective signal transmission coupling between the signal and receptor means in order to electrostatically transmit the AC signal from the signal means to the receptor means, and the signal and receptor means and the dielectric layer having electrical characteristics approaching a resonant frequency condition in the AC signal transmitting circuit whereby capacitive reactance and inductive reactance approach equality in order to optimize capacitive coupling.

14. The circuit board of claim 13 wherein the circuit board is of a multi-layer type having at least a third conductive layer and further wherein the additional conductive circuit means on the adjacent pairs of the first, second and third conductive layers form additional signal and receptor means separated by additional dielectric layers for developing effective signal transmitting coupling between sets of the additional signal and receptor means on the first and second conductive layers for electrostatic transmission of AC signals therebetween.

* * * * *